(12) United States Patent
Onishi

(10) Patent No.: US 7,738,526 B2
(45) Date of Patent: Jun. 15, 2010

(54) SURFACE EMITTING SEMICONDUCTOR LASER

(75) Inventor: Yutaka Onishi, Yokohama (JP)

(73) Assignee: Sumitomo Electric Industries Ltd., Osaka (JP)

(*) Notice: Subject to any disclaimer, the term of this patent is extended or adjusted under 35 U.S.C. 154(b) by 37 days.

(21) Appl. No.: 12/289,620

(22) Filed: Oct. 30, 2008

(65) Prior Publication Data

US 2009/0141766 A1 Jun. 4, 2009

(30) Foreign Application Priority Data

Nov. 6, 2007 (JP) .......................... P2007-289009

(51) Int. Cl.
*H01S 5/00* (2006.01)
(52) U.S. Cl. .............................. 372/50.124; 372/50.11
(58) Field of Classification Search .............. 372/50.11, 372/50.124
See application file for complete search history.

(56) References Cited

OTHER PUBLICATIONS

IEEE Journal of Selected Topics in Quantum Electronics, "Long-Wavelength Vertical-Cavity Surface-Emitting Lasers . . . by MOCVD", vol. 11, No. 5, Sep./Oct. 2005; N. Nishiyama et al.; pp. 990-998.

IEEE Photonics Technology Letters; "High Power Conversion Efficiencies and Scaling . . . Lasers", vol. 6, No. 7, Jul. 1994; K.L. Lear et al.; pp. 778-781.

*Primary Examiner*—Armando Rodriguez
(74) *Attorney, Agent, or Firm*—Smith, Gambrell & Russell, LLP

(57) ABSTRACT

In a surface emitting semiconductor laser, the primary surface of a substrate includes first to third areas. The first and second areas are contiguous to each other, and the third area surrounds the first and second areas. A first DBR is provided on the substrate. An active layer is provided on the following: the first DBR; the first and second areas; and a boundary therebetween. A first semiconductor spacer layer is provided on the active layer. A second semiconductor spacer layer is provided on the first semiconductor spacer layer. The conductivity type of the first semiconductor spacer layer is different from that of the second semiconductor spacer layer. A tunnel junction region is on the first area and between the first and the second semiconductor spacer layers. The active layer, the first semiconductor spacer layer, the second semiconductor spacer layer, the tunnel junction region constitutes an optical cavity mesa, which includes low-resistance and high-resistance regions located on the first area and the second area, respectively. The low-resistance region includes the tunnel junction region. A second DBR is on the second semiconductor spacer layer and the first area. A first electrode is on the first and second areas and the boundary.

20 Claims, 7 Drawing Sheets

(a)

(b)

(a)

(b)

(a)

(b)

(a)

(b)

(a)

(b)

SURFACE EMITTING SEMICONDUCTOR LASER

BACKGROUND OF THE INVENTION

1. Field of the Invention

The present invention relates to a surface emitting semiconductor laser.

2. Description of the Related Art

Document 1 (N. Nishiyama et al., IEEE Journal of Selected Topics in Quantum Electronics., vol. 11, no. 5, pp. 990-998, 2005.) discloses a tunnel junction surface emitting laser. An AlGaInAs/InP semiconductor distributed Bragg reflector and an n-type spacer layer are provided on a substrate. A semiconductor mesa is provided on the distributed Bragg reflector and includes an active layer, a tunnel junction region, and an InP spacer layer grown over the tunnel junction region. A dielectric distributed Bragg reflector is provided on the semiconductor mesa. An electrode is provided so as to surround the dielectric distributed Bragg reflector on the semiconductor mesa, and another electrode is provided so as to surround the semiconductor mesa on the n-type spacer layer.

Document 2 (K. L. Lear et al., IEEE Photonics Technology Letters., vol. 6, no. 7 , pp. 778-781, 1994.) discloses an surface emitting laser formed by using ion implantation. This surface emitting laser includes an n-type semiconductor mirror with 33-pair of layers, an active layer including three well layers, and a p-type semiconductor mirror with 22-pair of layers, which are arranged on a GaAs substrate. An electrode has a circular opening, and is provided on the p-type semiconductor mirror, which includes a cylindrical region that is located just below the opening, and the outer region that surrounds the cylindrical region. In the p-type semiconductor mirror, ions are implanted into the outer region. The ion implantation can provide a part of the p-type semiconductor mirror with high-resistance, and this part of high-resistance confines electric current.

SUMMARY OF THE INVENTION

In Document 1, in order to reduce parasitic capacitance, an optical cavity is formed in a shape of a mesa and includes an active layer. As the size of this semiconductor mesa decreases, heat generated in the semiconductor layer does not dissipate sufficiently, resulting in an increase in temperature during operation. This leads to narrow the modulation band and reduces the optical output power of the semiconductor laser.

In Document 2, in order to confine electrical current, a tubular region for current path is formed by providing the periphery of the semiconductor mesa with high resistance, and this periphery of the semiconductor mesa can prevent the generation of the surface recombination current in the mesa side face. Such a high resistance is provided by ion implantation. A distributed Bragg reflector is formed in alignment with the center of the semiconductor mesa. Since the distributed Bragg reflector is disposed right above the tubular region, the electrode on the semiconductor mesa is located above the periphery of high-resistance so as to surround the distributed Bragg reflector. The transverse path connecting the electrode to the tubular region is composed of a thin semiconductor with relatively high resistance. This structure causes an inevitable increase in resistance of the device.

It is an object of the present invention to provide a surface emitting semiconductor laser having a structure that can prevent saturation of optical output due to poor heat dissipation and can reduce the resistance of the device without an increase in parasitic capacitance.

In accordance with one aspect of the present invention, a surface emitting semiconductor laser includes a substrate, a first distributed Bragg reflector, an active layer, a first semiconductor spacer layer, a second semiconductor spacer layer, a tunnel junction region, a second distributed Bragg reflector, and a first electrode. The substrate has a primary surface and a back surface. The primary surface has first to third areas, the first and second areas are contiguous to each other, and the third area surrounding the first and second areas. The first distributed Bragg reflector is provided on the primary surface of the substrate. The active layer is on the first distributed Bragg reflector, the active layer is provided on the first and second areas, and the active layer is provided on a boundary between the first and second areas. The first semiconductor spacer layer is provided on the active layer. The second semiconductor spacer layer is provided on the first semiconductor spacer layer. The conductivity type of the first semiconductor spacer layer is different from that of the second semiconductor spacer layer. The tunnel junction region is on the first area, and the tunnel junction region has a tunnel junction. The tunnel junction region is provided between the first semiconductor spacer layer and the second semiconductor spacer layer. The active layer, the first semiconductor spacer layer, the second semiconductor spacer layer, and the tunnel junction region constitute an optical cavity mesa. The optical cavity mesa includes a low-resistance region and a high-resistance region. The low-resistance region is on the first area, whereas the high-resistance region is on the second area. The low-resistance region includes the tunnel junction region. The second distributed Bragg reflector is on the second semiconductor spacer layer and the first area. The first distributed Bragg reflector, the active layer, the tunnel junction region, and the second distributed Bragg reflector are arranged in a predetermined axis, which passes across the primary surface and the back surface of the substrate. The first electrode is on the second semiconductor spacer layer, and is provided on the first and second areas and the boundary.

The surface emitting semiconductor laser according to the present invention further comprises a third semiconductor spacer layer provided on the first distributed Bragg reflector; and a second electrode provided on a primary surface of the third semiconductor spacer layer. The primary surface of the third semiconductor spacer layer includes first to third areas. The first and second areas are contiguous to each other, the third area surrounds the first and second areas, and the third area adjoins the first and second areas. The high resistance region is provided on the second area of the substrate and the first area of the third semiconductor spacer layer. The tunnel junction region is provided on the first area of the substrate and the second area of the third semiconductor spacer layer. The second electrode is provided on the third area of the third semiconductor spacer layer.

In the surface emitting semiconductor laser according to the present invention, the first electrode includes an electrode pad, the electrode pad is provided on the first area of the substrate, and the third semiconductor spacer layer is not provided between the first area of the substrate and the electrode pad.

In the surface emitting semiconductor laser according to the present invention, a cross section of the optical cavity mesa has one of circular and ellipse.

In the surface emitting semiconductor laser according to the present invention, the optical cavity mesa are divided into a first portion and a second portion by a plane. The plane extends along a center axis of the optical cavity mesa. The first portion of the optical cavity mesa includes the tunnel junction. The side of the high resistance region is in conformity to a side face of the tunnel junction region.

In the surface emitting semiconductor laser according to the present invention, the high resistance region contains one of hydrogen and oxygen.

In the surface emitting semiconductor laser according to the present invention, the high resistance region contains one of ion-implanted hydrogen and ion-implanted oxygen.

In the surface emitting semiconductor laser according to the present invention, the cross section of the optical cavity mesa is taken along a reference plane intersecting the predetermined axis. The cross section of the tunnel junction region is taken along the reference plane, and the cross section of the optical cavity mesa has a symmetry, and positions of the centers of mass in the cross sections of the optical cavity mesa and the tunnel junction region are apart from each other on the reference plane.

In the surface emitting semiconductor laser according to the present invention, the side face of the optical cavity mesa is apart from the side face of the high-resistance region.

In the surface emitting semiconductor laser according to the present invention, each of the first and second semiconductor spacer layers includes the low-resistance region and the high-resistance region In the surface emitting semiconductor laser according to the present invention, the high-resistance region extends across a junction between the first and second semiconductor spacer layers.

In the surface emitting semiconductor laser according to the present invention, the low-resistance region extends across the junction.

In the surface emitting semiconductor laser according to the present invention, the high-resistance region extends in the direction of the predetermined axis, and the high-resistance region extends across a junction between the first and second semiconductor spacer layers.

In the surface emitting semiconductor laser according to the present invention, the low-resistance region extends along the side faces of the high-resistance region and the optical cavity mesa.

In the surface emitting semiconductor laser according to the present invention, the optical cavity mesa includes a semiconductor region, the semiconductor region is on the third area, and the resistivity of the high-resistance region is larger than that of the semiconductor region.

In the surface emitting semiconductor laser according to the present invention, the optical cavity mesa includes a semiconductor region provided on the third area. The semiconductor region surrounds the high-resistance region and the low-resistance region, and the semiconductor region is doped with neither ion-implanted hydrogen nor ion-implanted oxygen.

The surface emitting semiconductor laser according to the present invention further comprises a passivation film which covers a side and a top of the optical cavity mesa. The passivation film has a window located on the top of the optical cavity mesa. The size of the window is larger than that of a top of the tunnel junction region, and the second DBR is in contact with the optical cavity mesa through the window.

The surface emitting semiconductor laser according to the present invention further comprises a third semiconductor spacer layer provided on the first distributed Bragg reflector; and a second electrode provided on a primary surface of the third semiconductor spacer layer. The high-resistance region, the tunnel junction region, and the second electrode are arranged in a line on third semiconductor spacer layer.

In the surface emitting semiconductor laser according to the present invention, a part of the first electrode is located above the high-resistance region.

In the surface emitting semiconductor laser according to the present invention, the first distributed Bragg reflector is made of semiconductor, the second distributed Bragg reflector is made of insulating material, and the second distributed Bragg reflector being on a top of the optical cavity mesa.

BRIEF DESCRIPTION OF THE DRAWINGS

The above-described object and other objects, features, and advantages of the present invention will be more easily understood from the following detailed descriptions about preferred embodiments of the present invention with reference to the accompanying drawings.

DETAILED DESCRIPTION OF THE PREFERRED EMBODIMENTS

The teaching of the present invention will be readily understood through the following detailed description with reference to the accompanied drawings shown as examples. Embodiments of a surface emitting semiconductor laser will now be described with reference to the attached drawings. When possible, parts identical to each other will be referred to with symbols identical to each other.

Figure 1:
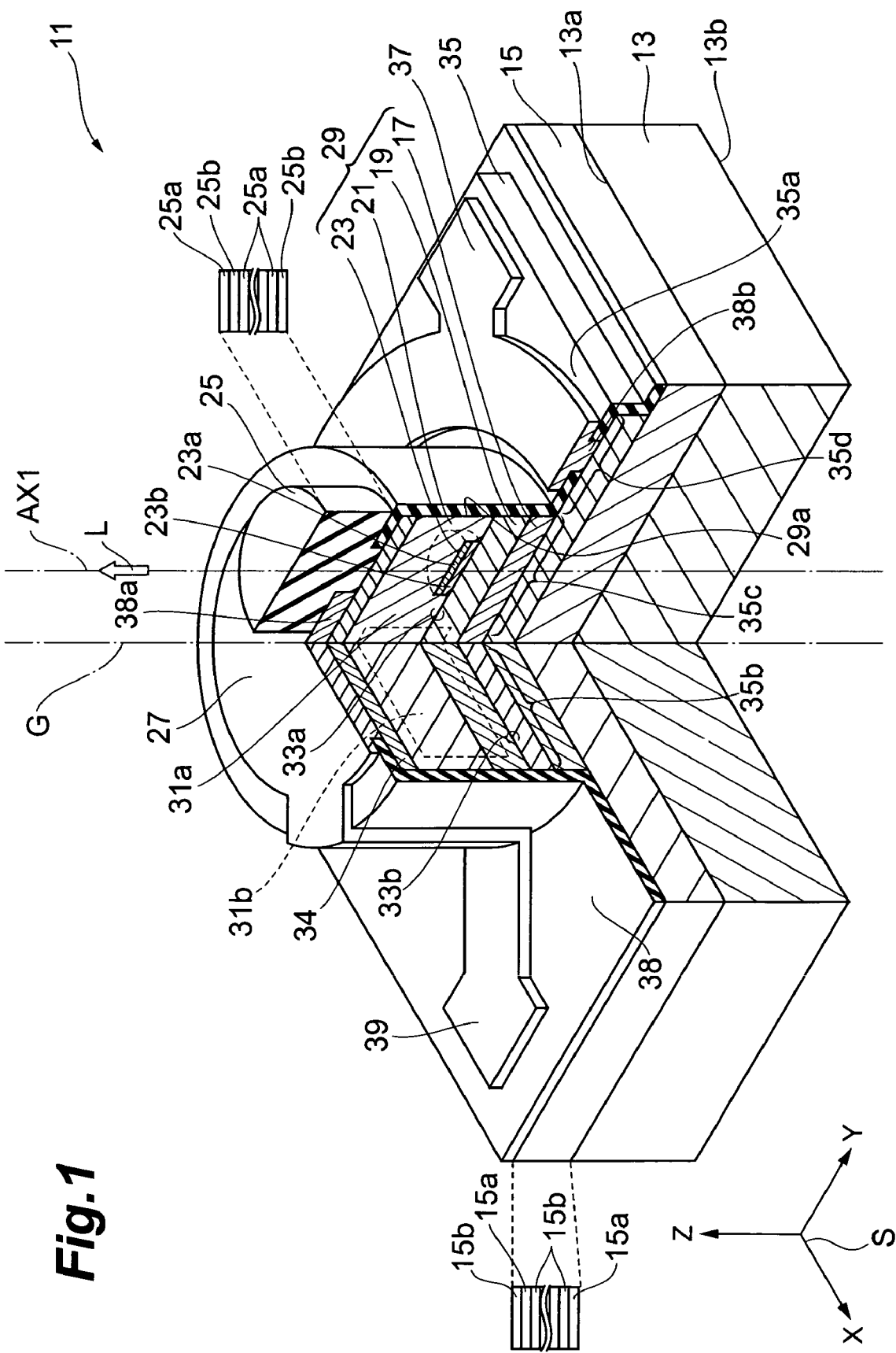
FIG. 1 illustrates a surface emitting semiconductor laser according to an embodiment of the present invention.

FIG. 1 illustrates a surface emitting semiconductor laser of an embodiment according to the present invention. The surface emitting semiconductor laser 11 includes a substrate 13, a first distributed Bragg reflector (hereinafter, referred to as "first DBR region") 15, an active layer 17, a first semiconductor spacer layer 19, a second semiconductor spacer layer 21, a tunnel junction region 23, a second distributed Bragg reflector (hereinafter, referred to as "second DBR region") 25, and a first electrode 27. The first DBR region 15 includes first and second semiconductor layers 15a and 15b which are alternately arranged, and the refractive index of the first semiconductor layer 15a is different from that of the second semiconductor layer 15b. The second DBR region 25 includes first and second layers 25a and 25b which are alternately arranged, and the refractive index of the first layer 25a is different from that of the second layer 25b. Preferably, the first and second layers 25a and 25b are composed of dielectric material, and the first and second layers 25a and 25b may be made of semiconductor. The tunnel junction region 23 includes a heavily doped semiconductor layer 23a of a first conductivity type and a heavily doped semiconductor layer 23b of a second conductivity type, and the semiconductor layers 23a and 23b constitute a tunnel junction. The tunnel junction region 23 converts types of carriers. The surface emitting semiconductor laser 11 emits laser beam "L" through the second DBR region 25.

The first DBR 15 is provided over the primary surface 13a of the substrate 13, which extends along the xy plane in the orthogonal coordinate system "S." The active layer 17 is provided on the first DBR 15. The first semiconductor spacer layer 19 is provided over the active layer 17, and the second semiconductor spacer layer 21 is provided over the first semiconductor spacer layer 19. The tunnel junction region 23 is provided between the first semiconductor spacer layer 19 and the second semiconductor spacer layer 21. The first electrode 27 is provided on the second semiconductor spacer layer 21. The first DBR 15, the active layer 17, the tunnel junction region 23, and the second DBR region 25 are arranged in a predetermined axis "AX1," i.e., axis z in the orthogonal coordinate system "S", and this predetermined axis is, for example, orthogonal to the primary surface 13a and the back surface 13b of the substrate 13.

The active layer 17, the first semiconductor spacer layer 19, the second semiconductor spacer layer 21, and the tunnel junction region 23 constitutes an optical cavity mesa 29. The first electrode 27 and the second DBR region 25 are disposed above the optical cavity mesa 29.

The first and second semiconductor spacer layers 19 and 21 include a low-resistance region 31a and a high-resistance region 31b. The high-resistance region 31b intersects a boundary 33b between the first and second semiconductor spacer layers 19 and 21 and extends in the predetermined axis "AX1" along the side face 19a of the optical cavity mesa 19. In the low-resistance region 31a, the conductivity type of the first semiconductor spacer layer 19 is different from that of the second semiconductor spacer layer 21. The low-resistance region 31a intersects a boundary (pn junction) 33a between the first and second semiconductor spacer layers 19 and 21, and extends along the side of the high-resistance region 31b and the side 29a of the optical cavity mesa 29.

Figure 2:
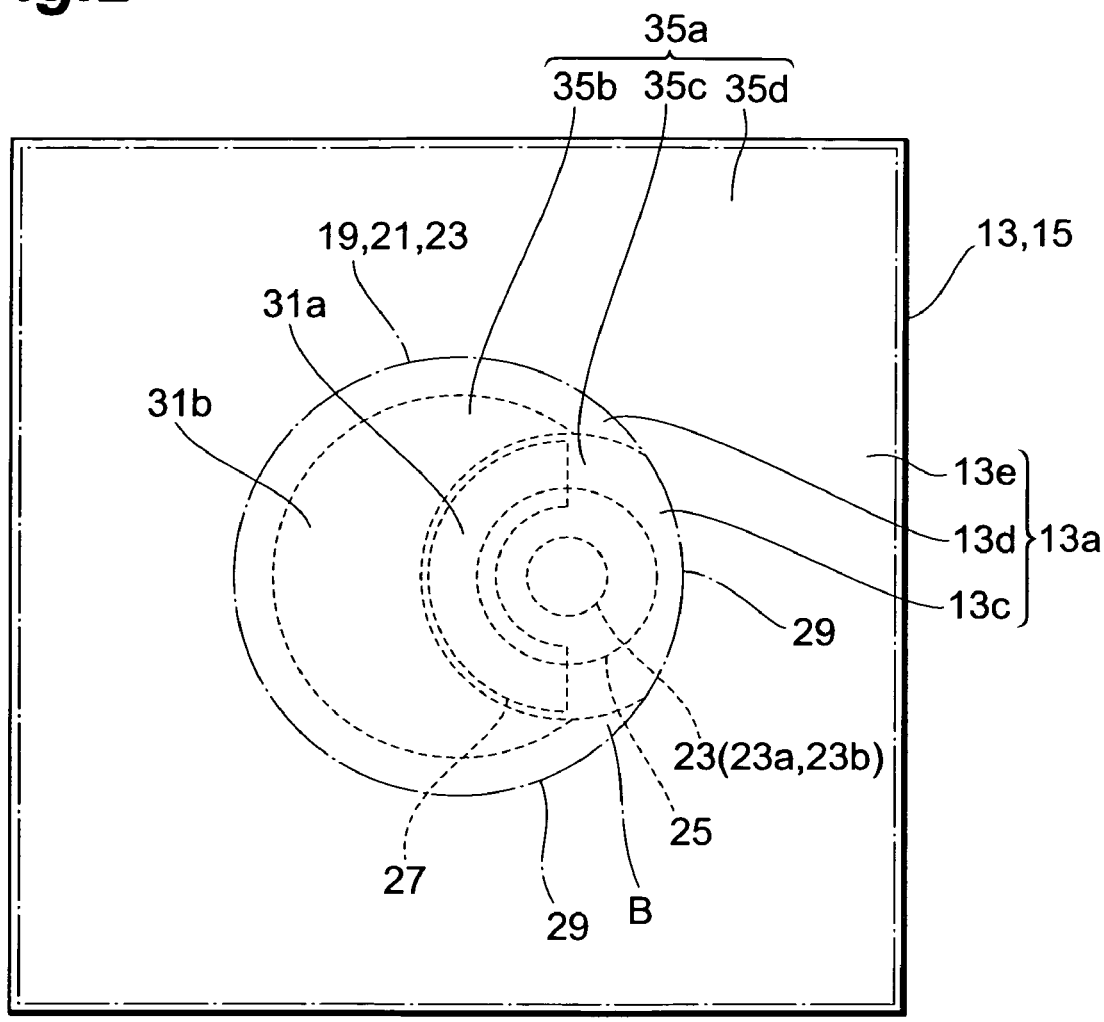
FIG. 2 is a plan view of the surface emitting semiconductor laser shown in FIG. 1.

FIG. 2 is a plan view of the surface emitting semiconductor laser illustrated in FIG. 1. The primary surface 13a of the substrate 13 includes a first to third area 13c, 13d, and 13e. The first and second areas 13c and 13d is adjacent form each other. The third area 13e surrounds the first and second areas 13c and 13d, and can be adjacent to the first and second areas 13c and 13d. The boundary line "B" indicates the border between the first area 13c and the second area 13d. In a preferred embodiment, the shape of the combined first and second areas 13c and 13d can be circular or elliptical.

The second DBR 25 is located above the second semiconductor spacer layer 21 above the first area 13c. The tunnel junction region 23 is located above the first area 13c between the first semiconductor spacer layer 19 and the second semiconductor spacer layer 21, and the first semiconductor spacer layer 19 and second semiconductor spacer layer 21 form a junction 33a. The active layer 17 is disposed above the boundary line "B" as well as the first and second areas 13c and 13d. The first electrode 27 can be disposed above the first and second areas 13c and 13d and the boundary line B, and is preferably in contact with the upper surface of the low-resistance region 31a. The low-resistance region 31a of the first and second semiconductor spacer layers 19 and 21 is disposed above the first area 13c, and the high-resistance region 31b of the first and second semiconductor spacer layers 19 and 21 is disposed above the second area 13d. The resistivity of the low-resistance region 31a is smaller than that of the high-resistance region 31b.

In this surface emitting semiconductor laser 11, the high-resistance region 31b intersects the boundary 33b between the first and second semiconductor spacer layers 19 and 21 above the second area 13d, whereas the low-resistance region 31a intersects the boundary 33a between the first and second semiconductor spacer layers 19 and 21 above the first area 13c. Adjustment of the high-resistance region 31b in the optical cavity mesa 29 to a proper size can prevent an increase in parasitic capacitance and ensures an adequate size necessary to heat dissipation of the optical cavity mesa 29. Furthermore, the tunnel junction region 23 is provided above the first area 13c while the high-resistance region 31b is provided above the second area 13d. As a result, the high-resistance region 31b does not surround the tunnel junction region 23 while the low-resistance region 31a extends along the high-resistance region 31b and the side face 29a of the optical cavity mesa 29. In this configuration, the adjustment of the shape and size of the low-resistance region 31a allows the second DBR 25 to reside above the tunnel junction region 23. In the optical cavity mesa 29, the high-resistance region 31b adjoins the low-resistance region 31a. In this configuration, the adjustment of the size and shape of the first electrode 27 on the first and second areas 13c and 13d and the boundary line "B" can prevent an increase in resistance in the current path from the first electrode 27 to the tunnel junction region 23. For example, the first electrode 27 is connected to a contact layer 34.

With reference to FIG. 1 again, the surface emitting semiconductor laser 11 may further include a third semiconductor spacer layer 35 and a second electrode 37. The third semiconductor spacer layer 35 is provided above the first distributed Bragg reflector 13. The second electrode 37 is provided above the third semiconductor spacer layer 35. The primary surface 35 of the third semiconductor spacer layer 35 includes, first, second, and third areas 35b, 35c, and 35d arranged in sequence. In the third semiconductor spacer layer 35, the high-resistance region 31b resides above the first area 35b, the tunnel junction region 23 resides above the second area 35c, and the second electrode 37 resides above the third area 35d. In this surface emitting semiconductor laser 11, since the tunnel junction region 23 resides above the second area 35c, the active layer 17 on the second area 35c contributes to light emission. In addition, the high-resistance region 31b, the tunnel junction region 23, and the second electrode 37 are arranged in the first, second, and third area 35b, 35c, and 35d, respectively. This arrangement enables the second electrode 37 to reside close to the active layer 17, resulting in suppression of an increase in resistance.

In the surface emitting semiconductor laser 11, the first electrode 27 includes an electrode pad 39, which can extend from the optical cavity mesa 29 to the area 13e of the substrate 13. Since the third semiconductor spacer layer is not provided between the electrode pad 39 and the third area 13e of the substrate 13, capacitance defined by the electrode pad 39 and the third semiconductor spacer layer 35 can be reduced.

The high-resistance region 31b preferably contains at least one of hydrogen and oxygen. The incorporation of hydrogen or oxygen into the high-resistance region 31b ensures high resistance. Ion implantation allows the formation of the high-resistance region 31b having a desirable shape without heat treatment or annealing during the process.

The surface of semiconductor regions, for example, the optical cavity mesa 29 of the surface emitting semiconductor laser 11, is covered with an insulating film 38. The insulating film 38 has one opening 38a located above the optical cavity mesa 29 and another opening 38b located on the third semiconductor spacer layer 35. The opening 38a is provided above the high-resistance region 31*b* and the low-resistance region 31*a*, and preferably is confined to the placement above the low-resistance region 31*a*. The opening 38*a* may be provided so as to avoid the region above the high-resistance region 31*b*, if necessary. An electrode 27 is disposed in a part of the opening 38*a* and is in contact with the contact layer 34 therein. A second DBR 25, instead of the electrode 27, is disposed in the remaining part of the opening 38*a*. The insulating film 38 may be composed of, for example, silicon oxide or silicon nitride.

Figure 3:
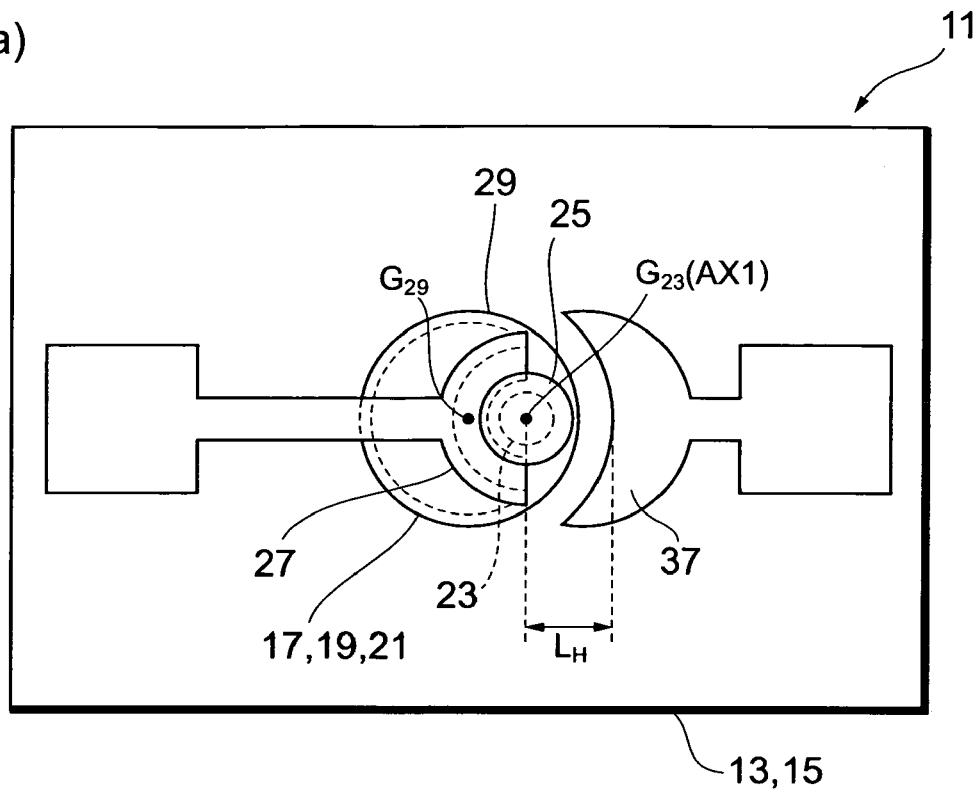
FIG. 3 is a plan view of a surface emitting semiconductor laser of an embodiment of the invention and a surface emitting semiconductor laser for comparison.
Figure 3:
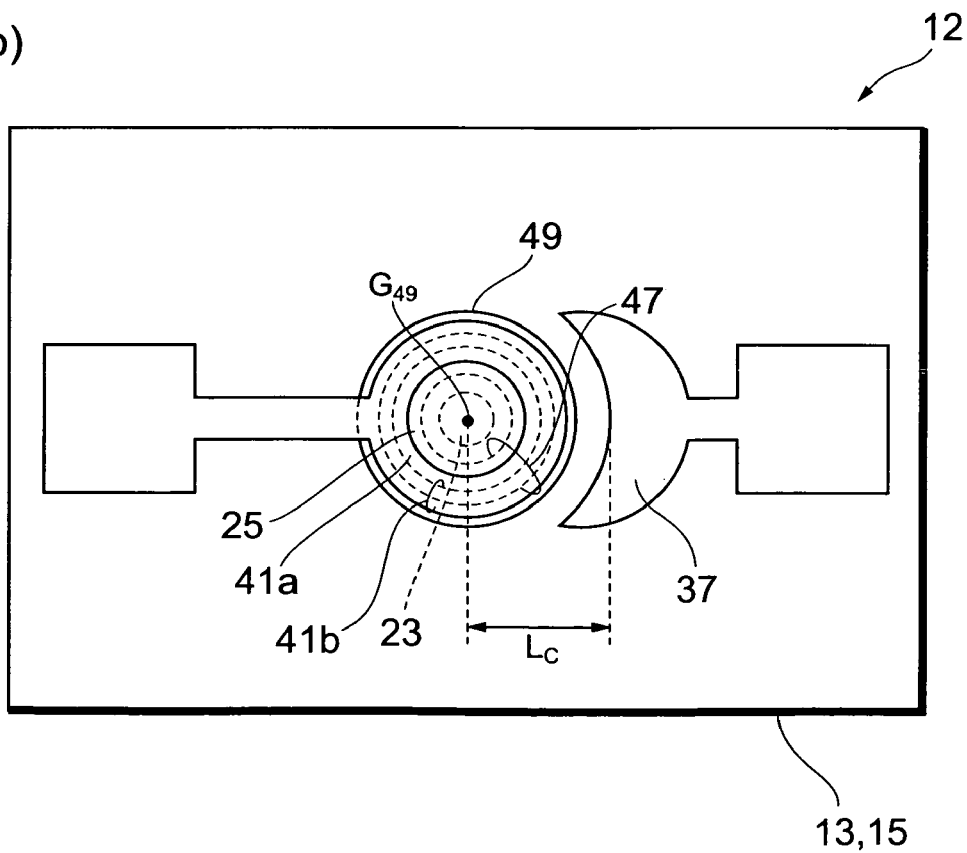

Part (a) of FIG. 3 is a plan view of the surface emitting semiconductor laser according to this embodiment, and Part (b) of FIG. 3 is a plan view of a comparative surface emitting semiconductor laser. With reference to Part (a) of FIG. 3, the optical cavity mesa 29 preferably has a circular or elliptical cross-section. Since the optical cavity mesa 29 has a curved side face 29*a*, the profile of the laser beam from the surface emitting semiconductor laser can be symmetric. The optical cavity mesa 29 consists of two segments that are delimited by a reference plane passing through the center axis "$G_{29}$" of the optical cavity mesa 29. The tunnel junction region 23 is contained in one segment of the optical cavity mesa 29, and the side face of the high-resistance region 31*b* is curved in conformity to the side face of the tunnel junction region 23. The convex side face of the high-resistance region 31*b* can satisfactorily control the shape of the current flowing pass.

The optical cavity mesa 29 and the tunnel junction region 23 have an optical cavity mesa cross-section and a tunnel junction region cross-section, respectively, and these cross-sections are defined by the respective intersections of the optical cavity mesa 29 and the tunnel junction region 23 with the reference plane that intersects the predetermined axis "AX1." The optical cavity mesa cross-section is symmetric, and the position of the center of mass "$G_{29}$" of the cross-section of the optical cavity mesa is different from the center of mass AX1 of the cross-section of the tunnel junction region, where the center of mass of the relevant object is defined as a point at which a primary moment of the object is zero in the cross-sectional figure. The position of the center of mass "$G_{29}$" of the optical cavity mesa cross-section is different from the center of mass "$G_{23}$," located on the axis AX1, of the tunnel junction region cross-section in this surface emitting semiconductor laser 11, and thus the position of the second DBR 25 shifts from the center of mass "$G_{29}$." The optical cavity is therefore located in a region outside the center of mass "$G_{29}$" of the optical cavity mesa 29. When optical cavity mesas have a circular or elliptic cross-section, they have an optical cavity mesa cross-section with the center of mass "$G_{29}$" just at the center of the circle or ellipse of the cross-section.

In the surface emitting semiconductor laser 11, the cross-section of the optical cavity mesa 29 is defined as the intersection of the optical cavity mesa 29 with the reference plane that intersects the predetermined axis "AX1." The cross-section of the high-resistance region is defined as the intersection of the high-resistance region 31*b* with the reference plane that intersects the predetermined axis "AX1." The cross-section of the optical cavity mesa has a symmetrical shape, and the position of the center of mass "$G_{29}$" of the optical cavity mesa cross-section is different from that of the high-resistance region cross-section. The position of the center of mass of the optical cavity mesa cross-section is different from that of the high-resistance region. Since the position of the second DBR 25 shifts from the center of mass "$G_{29}$" of the optical cavity mesa 29, the low-resistance region 31*a* for the optical cavity is located off the center of mass "$G_{29}$" of the optical cavity mesa 29 between the first DBR 15 and the second DBR 25.

The cross-section of the tunnel junction region is defined as the intersection of the tunnel junction region 23 with the reference plane that intersects the predetermined axis "AX1." The cross-section of the optical cavity mesa has a symmetrical shape. When the position of the center of mass "$G_{23}$" of the cross-section of the tunnel junction region is different from that of the center of mass "$G_{29}$" of the cross-section of the high-resistance region, the position of the second DBR 25 shifts from the center of mass of the cross-section of the high-resistance region while the position of the first electrode 27 shifts from the center of mass of the cross-section of the high-resistance region.

As shown in Part (b) of FIG. 3, in the surface emitting semiconductor laser 12, the centers of mass of the second DBR 25, the tunnel junction region 23, the low-resistance region 41*a*, and the high-resistance region 41*b* conform to the center of mass "$G_{49}$" of the optical cavity mesa 49.

High-speed operation of the surface emitting semiconductor laser requires reductions in capacitance and resistance of the device. The capacitance can be reduced by the formation of an optical cavity mesa, as is described in Document 1. A smaller optical cavity mesa, however, causes poor heat dissipation, which narrows the modulation band due to saturation of optical output. In Document 2, ion implantation is employed for current confinement. Since the ion-implanted region has high resistance, the capacitance will be reduced. For current confinement, ion implantation must be carried out to the periphery of the optical cavity mesa so as to leave a low-resistance region in the inner portion of the optical cavity mesa. If ion implantation is not carried out to the periphery of the optical cavity mesa, surface recombination current is generated in the optical cavity mesa and flows through the side face of the mesa. The recombination current significantly degrades the current injection efficiency. Since the ion-implanted region has reduced crystallinity, the recovery of the crystallinity by annealing is necessary for the formation of an electrode.

In the semiconductor laser including the tunnel junction region shown in Part (b) of FIG. 3, annealing for the recovery of crystallinity, however, diffuse dopant atoms in the tunnel junction and thus causes an increase in resistance of the device. In addition, in an intracavity contact structure, carries from the electrode flow away from the ion-implanted region. Thus, the current from the electrode flows through a thin unimplanted layer in the transverse direction, and then reaches the active layer. Such transverse current causes an increase in resistance of the device, which offsets the advantage of reduced capacitance by ion implantation and cannot enhance the modulation band.

On the other hand, in the surface emitting semiconductor laser 11 including the tunnel junction mesa shown in Part (a) of FIG. 3, the optical cavity mesa 29 is formed for a reduction in capacitance. The center of mass of the optical cavity mesa 29 is displaced from the center of the mass of the tunnel junction region (tunnel junction mesa) 23 so that the optical cavity mesa 29 and the tunnel junction region 23 are asymmetrically arranged. In order to reduce the capacitance, ion implantation is carried out into a part of the optical cavity mesa 29 to form a high-resistance region 31*b*, and the part of the optical cavity mesa 29 is different from the low-resistance region 31*a*. An electrode 27 is formed on an unimplanted high-crystallinity region different from the surface just above the high-resistance region 31*b*, and the electrode 27 is also in contact with the unimplanted high-crystallinity region, this electrode has satisfactory contact characteristics without both anneal for the recovery from ion implantation damage and increase in resistance of the tunnel junction. As shown in Part (a) of FIG. 3, a tunnel junction region 23 is provided between the high-resistance region 31b and the second electrode 37 so that the tunnel junction region 23 is closer to the second electrode 37. This configuration can reduce the distance between the tunnel junction region 23 and the second electrode 37, and can prevent current from flowing transversely, which causes an increase in resistance in the current path from the active layer 17 to the second electrode 37. In the optical cavity mesa 29, since the current is confined by the tunnel junction region 23 embedded in the mesa, the low-resistance region 31a need not be surrounded by the high-resistance region 31b. Accordingly, even when ion-implantation is carried out to form an asymmetric high-resistance region, no recombination current occurs on the surface of the optical cavity mesa 29.

Figure 4:
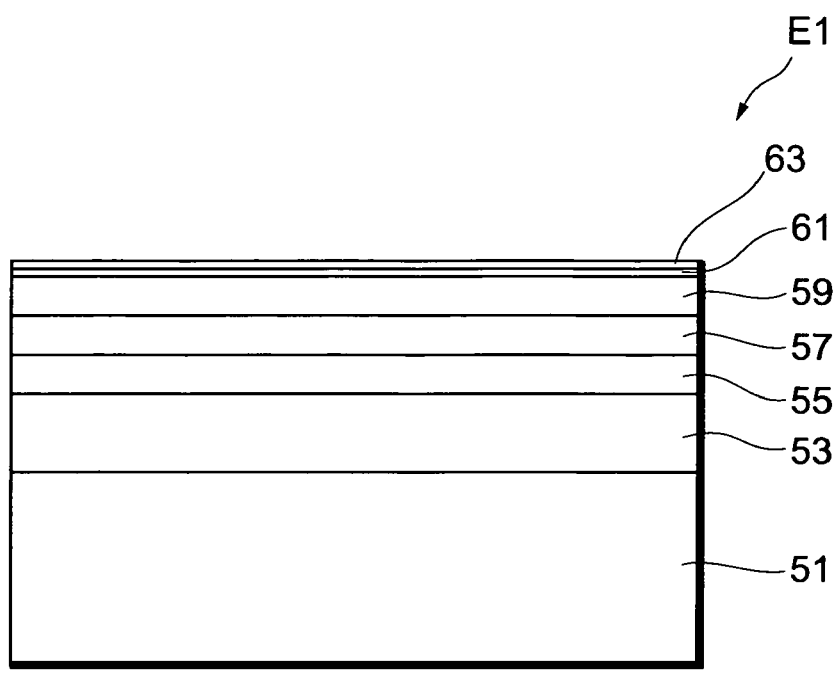
FIG. 4 illustrates primary steps in a method of fabricating a surface emitting laser device according to an embodiment of the present invention.
Figure 4:
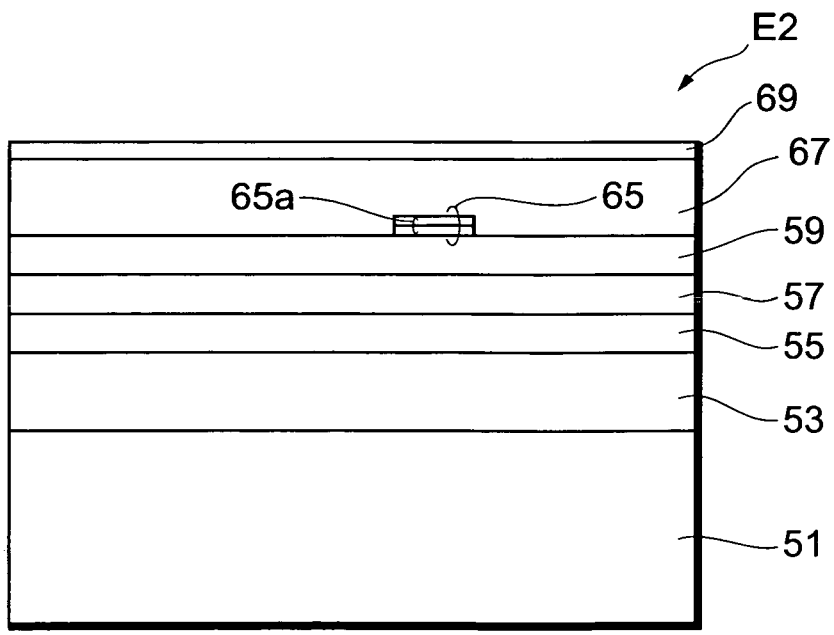
Figure 5:
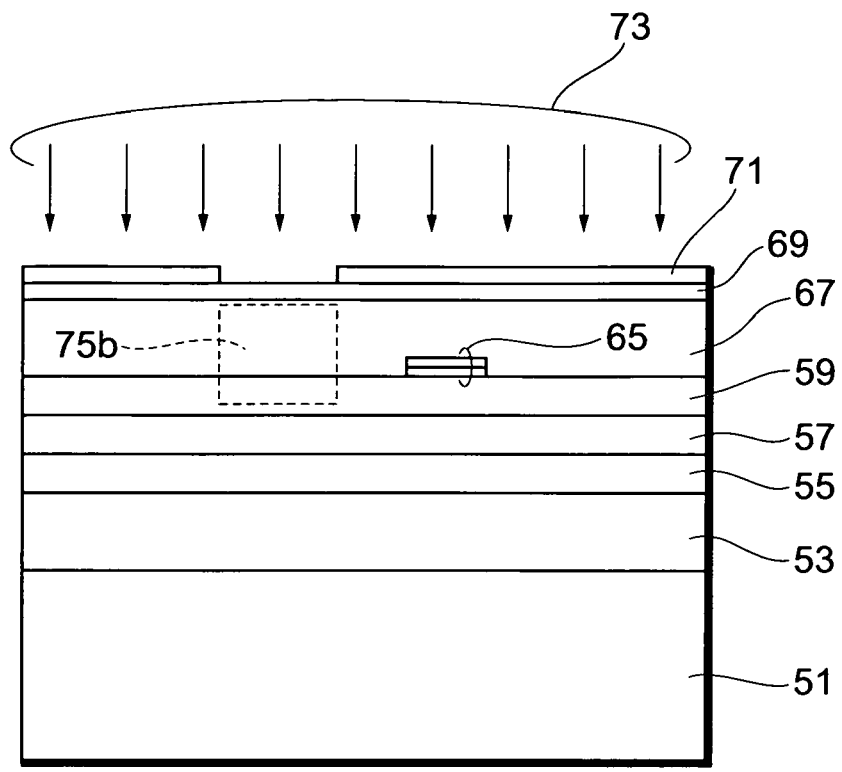
FIG. 5 illustrates primary steps in a method of fabricating a surface emitting laser device according to an embodiment of the present invention.
Figure 5:
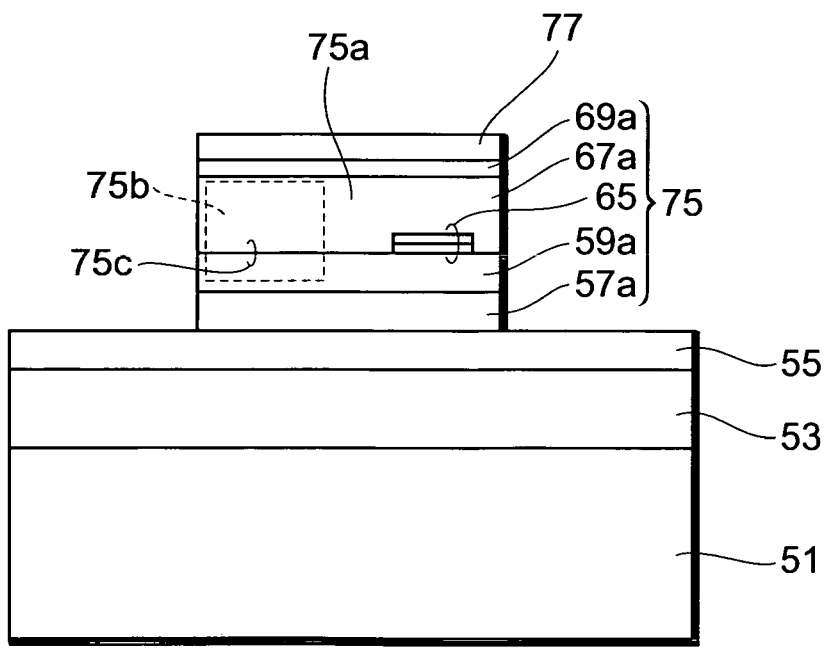
Figure 6:
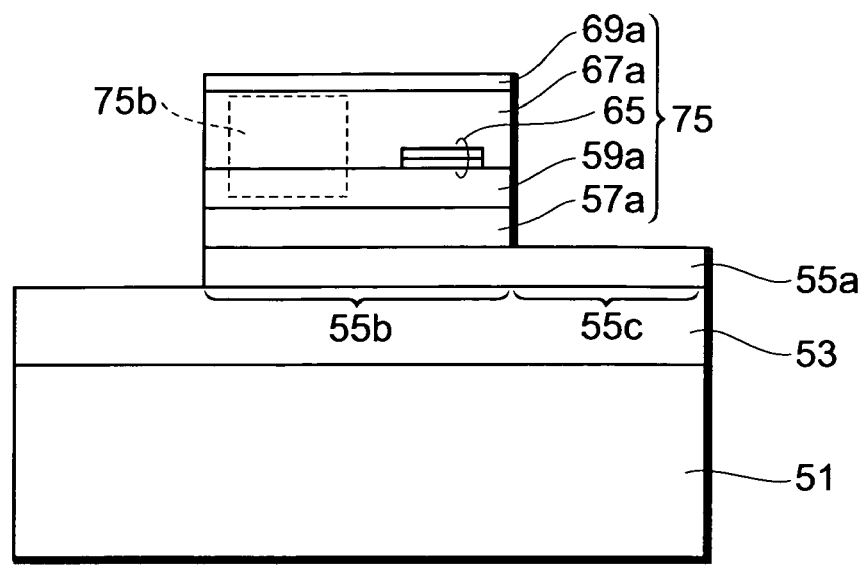
FIG. 6 illustrates primary steps in a method of fabricating a surface emitting laser device of an embodiment according to the present invention.
Figure 6:
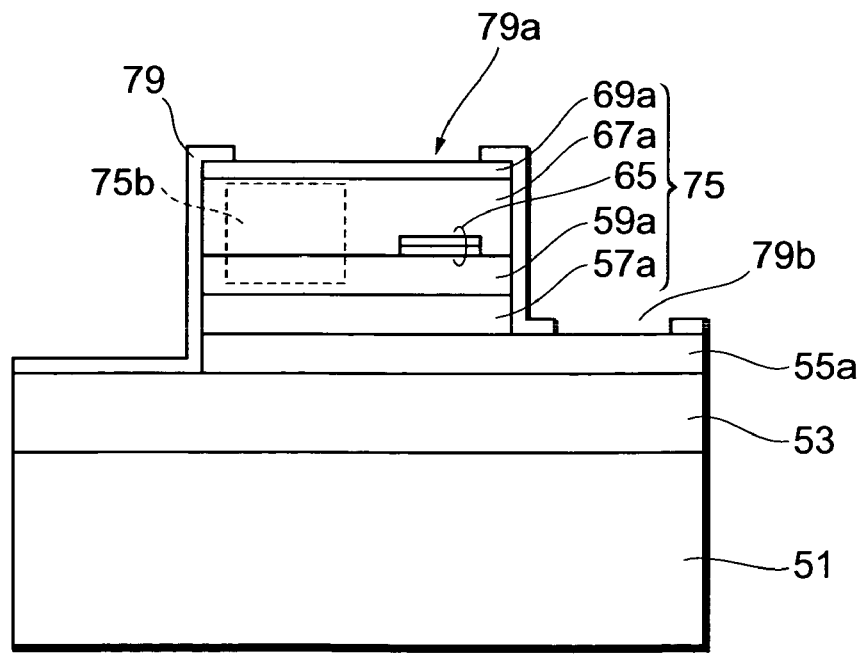

With reference to FIGS. 4, 5, and 6, a process of forming a surface emitting laser is described. With reference to Part (a) of FIG. 4, the following regions are formed in sequence on a semi-insulating GaAs substrate 51: a first DBR region 53 (for example, thirty-two pairs of undoped $GaAs/Al_{0.9}Ga_{0.1}As$); a semiconductor spacer layer 55 (for example, Si-doped n-type GaAs); an active layer 57 (for example, three-layer $In_{0.2}Ga_{0.8}As$ well layer); a semiconductor spacer 59 (C-doped p-type GaAs, 300 nm thick); and first and second heavily doped semiconductor layers 61 and 63 (for example, heavily C-doped $p^{++}$-type InGaAs/heavily Si-doped $n^{++}$-type InGaAs, 20 nm thick) for a tunnel junction region. These semiconductor regions are deposited by MOVEP to prepare an epitaxial substrate E1. The heavily C-doped InGaAs has a hole concentration of $5 \times 10^{19}$ cm$^{-3}$ while the heavily Si-doped InGaAs has an electron concentration of $5 \times 10^{18}$ cm$^{-3}$.

After the epitaxial substrate E1 is taken out from the reactor, as shown in Part (b) of FIG. 4, a mask, such as a resist mask, for the tunnel junction region is formed by photolithography. The diameter of the mask is, for example, 5 μm. Through the mask, the first and second heavily doped semiconductor layer 61 and 63 are partially etched by wet etching to form a tunnel junction region 65. This tunnel junction region 65 includes a tunnel junction 65a. The diameter of the tunnel junction region 65 is, for example, 5 μm.

After cleaning the wafer, the wafer is placed into the reactor. A semiconductor spacer layer 67 (for example, Si-doped n-type GaAs, 200 nm thick) and a contact layer 69 (for example, Si-doped n-type GaAs, 50 nm thick) are deposited in sequence to form an epitaxial substrate E2. The thickness of the semiconductor spacer 59 is, for example, 300 nm, the thickness of the semiconductor spacer layer 67 is, for example, 200 nm, and the thickness of the contact layer is, for example, 50 nm.

After the epitaxial substrate E2 is taken out from the reactor, as shown in Part (a) of FIG. 5, a mask 71, such as a resist mask, for ion implantation is formed on the epitaxial substrate E2 by photolithography. The opening in the mask 71 has, for example, a circular shape. Through the mask 71, ion implantation 73 is carried out to form a high-resistance region. The high-resistance region by the ion implantation 73 is not formed in the tunnel junction region 65. The high-resistance region 75b is formed over the semiconductor spacer 59 and the semiconductor spacer layer 67, but not formed over the contact layer 69. The acceleration energy of the ion implantation is, for example, 100 keV, and the dose is, for example, $1 \times 10^{15}$ cm$^{-2}$. Hydrogen ion (H$^+$) can be used as, for example, ion species. The hydrogen ions are introduced into the region that is not covered by the resist mask. Hydrogen atoms are primarily distributed in the range of about 100 nm to about 500 nm in terms of depth taken from the surface. Instead of hydrogen ion, oxygen ion (O$^+$) may be used as well. As described above, annealing is not carried out after ion implantation.

After removing the mask 71, as shown in Part (b) of FIG. 5, a mask 77 for optical cavity mesa is formed. Dry etching can be used through the mask 77 to form an optical cavity mesa 75. The optical cavity mesa 75 includes a contact layer 69a, a semiconductor spacer layer 67a, a tunnel junction region 65, a semiconductor spacer layer 59a, and a semiconductor spacer layer 57a. The optical cavity mesa 75 includes a high-resistance region 75b and a low-resistance region 75a, and the high-resistance region 75b extends beyond the boundary 75c.

With reference to Part (a) of FIG. 6, after forming the optical cavity mesa 75, the semiconductor spacer layer 55 is partially removed to form a contact layer 55a. The contact layer 55a includes a base 55b below the optical cavity mesa 75 and an extension 55c extending from the base 55b that connects with the low-resistance region 75a of the optical cavity mesa 75, and the base 55b is adjacent to the extension 55c.

With reference to Part (b) of FIG. 6, a passivation film 79 such as a silicon nitride film, is formed to protect the surface of the optical cavity mesa 75 and the contact layer 55a. The passivation film 79 includes first and second electrode windows 79a and 79b. The first electrode window 79a resides on the top face of the optical cavity mesa 75, whereas the second electrode window 79b resides on the contact layer 55a.

Figure 7:
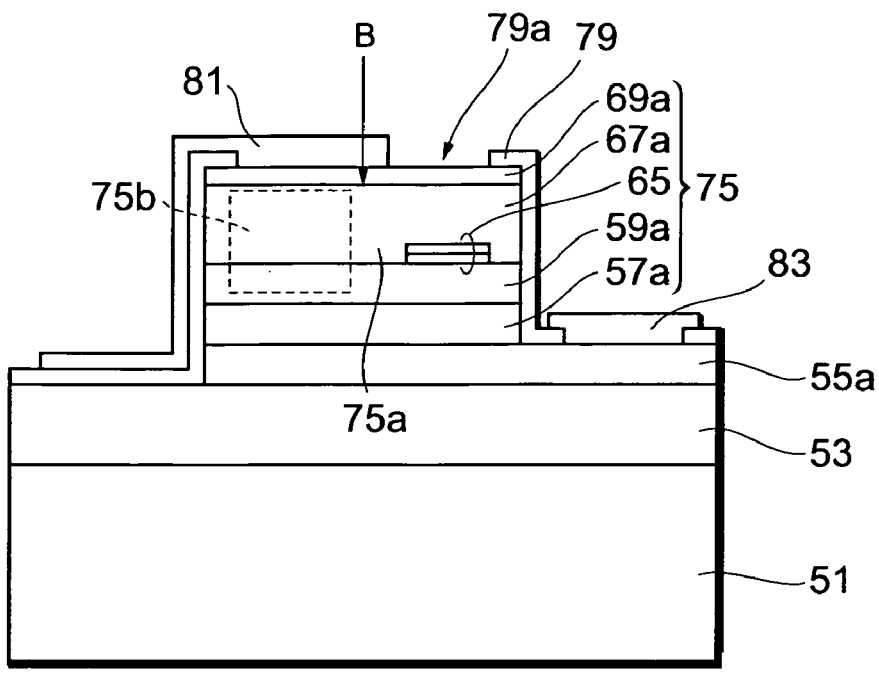
FIG. 7 illustrates primary steps in a method of fabricating a surface emitting laser device according to an embodiment of the present invention.
Figure 7:
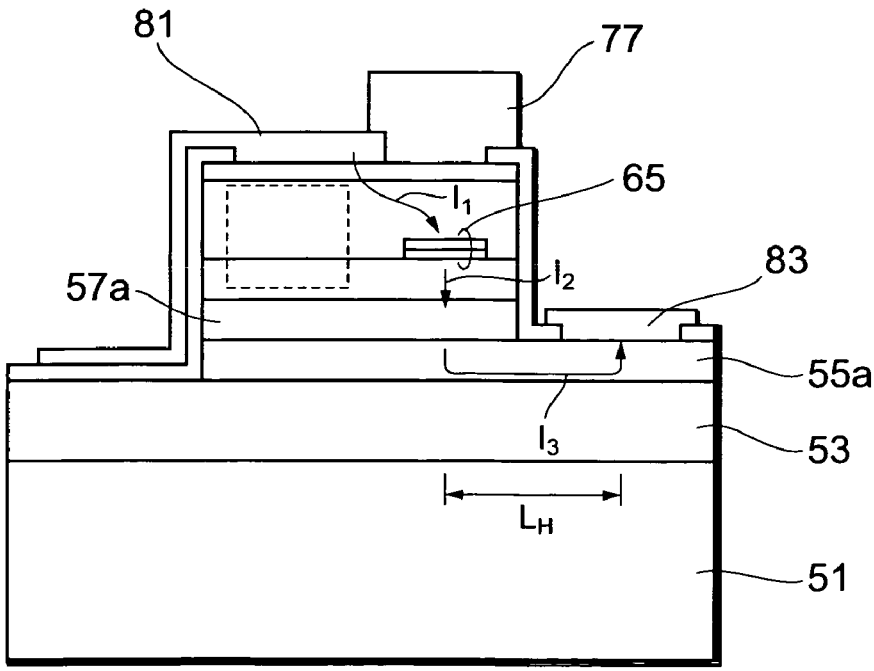

With reference to Part (a) of FIG. 7, an upper electrode 81 is formed by liftoff so as to cover part of the first electrode window 79a on the low-resistance region 75a, the high-resistance region 75b and the boundary B, whereas a lower electrode 83 is formed by liftoff over the second electrode window 79b.

With reference to Part (b) of FIG. 7, after the electrode is formed by evaporation, a dielectric DBR 77 is formed by liftoff. The dielectric DBR 77 covers the residual portion of the first electrode window 79a. The dielectric DBR 77 is composed of, for example, a laminate made of $SiO_2/TiO_2$. The primary steps for fabrication of the surface emitting semiconductor laser shown in Part (a) of FIG. 3 are described above.

In this surface emitting semiconductor laser, the optical cavity mesa 75 has a diameter of 30 μm, the center of the optical cavity mesa 75 and the center of the tunnel junction region (tunnel junction mesa) 65 are intentionally displaced from each other. The distance, taken in the transverse direction, between the end of the upper electrode 81 and the periphery of the tunnel junction mesa is 5 μm. Hydrogen ions are implanted into an area that is two thirds of the upper area of the optical cavity mesa. Implantation is not carried out over the entire periphery of the tunnel junction mesa, in other words, an unimplanted region remains in the tunnel junction mesa. The optical cavity mesa 75 is formed such that the tunnel junction mesa is close to the lower electrode 83.

For comparison, a surface emitting semiconductor laser having a structure shown in Part (b) of FIG. 3 is prepared. The optical cavity mesa has a diameter of 30 μm, and the tunnel junction mesa has a diameter of 5 μm. Hydrogen ions are implanted into an outer annular region with an inner diameter of 10 μm with reference to the center of the tunnel junction mesa. The upper electrode has an annular shape with an inner diameter of 15 μm.

A device parameter S11 was measured with an S parameter extracting apparatus. In the embodiment, the optical cavity mesa had a capacitance of 135 femtofarads (fF) and a resistance of 50 ohms (Ω). In contrast, the optical cavity mesa in the structure shown in Part (b) of FIG. 3 had a capacitance of 136 fF and a resistance of 110 ohms. The structure according to the embodiment can achieve a significantly reduced resistance without a substantial increase in capacitance. The high-resistance region made by ion implantation contributes to reduced capacitance. In the structure shown in Part (b) of FIG. 3, transverse current flow causes an increase in resistance of the device in the path from the upper electrode to the tunnel junction mesa. In contrast, in the structure shown in Part (a) of FIG. 3, Part (b) of FIG. 7 shows the following: current $I_1$ flows from the electrode 81 to the tunnel junction region 65; current $I_2$ flows from tunnel junction region 65 to the active layer 57a; and current $I_3$ flows from the active layer 57a to the electrode 83. The deviation of the center of the optical cavity mesa from the center of the tunnel junction region can shorten the horizontal distance $L_H (<L_C)$ between the lower electrode and the tunnel junction, and thus can reduce the resistance between the lower electrode and the tunnel junction region. Accordingly, the capacitance can be reduced while the low resistance of the entire device is maintained.

Having described and illustrated the principle of the invention in a preferred embodiment thereof, it is appreciated by those having skill in the art that the invention can be modified in arrangement and detail without departing from such principles. Details of structures of these devices can be modified as necessary. We therefore claim all modifications and variations coming within the spirit and scope of the following claims.

What is claimed is:

1. A surface emitting semiconductor laser comprising:
 a substrate having a primary surface and a back surface, the primary surface having first to third areas, the first and second areas being contiguous to each other, and the third area surrounding the first and second areas;
 a first distributed Bragg reflector provided on the primary surface of the substrate;
 an active layer on the first distributed Bragg reflector, the active layer being provided on the first and second areas, and the active layer being provided on a boundary between the first and second areas, and;
 a first semiconductor spacer layer provided on the active layer;
 a second semiconductor spacer layer provided on the first semiconductor spacer layer, a conductivity type of the first semiconductor spacer layer being different from that of the second semiconductor spacer layer;
 a tunnel junction region on the first area, the tunnel junction region having a tunnel junction, the tunnel junction region being provided between the first semiconductor spacer layer and the second semiconductor spacer layer, the active layer, the first semiconductor spacer layer, the second semiconductor spacer layer, and the tunnel junction region constituting an optical cavity mesa, the optical cavity mesa including a low-resistance region and a high-resistance region, the low-resistance region being on the first area, the high-resistance region being on the second area, and the low-resistance region including the tunnel junction region;
 a second distributed Bragg reflector on the second semiconductor spacer layer and the first area, the first distributed Bragg reflector, the active layer, the tunnel junction region, and the second distributed Bragg reflector being arranged in a predetermined axis, and the predetermined axis passing across the primary surface and the back surface of the substrate: and
 a first electrode on the second semiconductor spacer layer, the first electrode being provided on the first and second areas and the boundary.

2. The surface emitting semiconductor laser according to claim 1, further comprising:
 a third semiconductor spacer layer provided on the first distributed Bragg reflector; and
 a second electrode provided on a primary surface of the third semiconductor spacer layer,
 wherein the primary surface of the third semiconductor spacer layer including first to third areas,
 the first and second areas are contiguous to each other, the third area surrounds the first and second areas,
 the third area adjoins the first and second areas,
 the high resistance region is provided on the second area of the substrate and the first area of the third semiconductor spacer layer,
 the tunnel junction region is provided on the first area of the substrate and the second area of the third semiconductor spacer layer, and
 the second electrode is provided on the third area of the third semiconductor spacer layer.

3. The surface emitting semiconductor laser according to claim 2, wherein the first electrode includes an electrode pad, the electrode pad is provided on the first area of the substrate, and
 the third semiconductor spacer layer is not provided between the first area of the substrate and the electrode pad.

4. The surface emitting semiconductor laser according to claim 1, wherein a cross section of the optical cavity mesa has one of circular and ellipse.

5. The surface emitting semiconductor laser according to claim 1, wherein the optical cavity mesa are divided into a first portion and a second portion by a plane, the plane extends along a center axis of the optical cavity mesa, the first portion of the optical cavity mesa includes the tunnel junction, and a side of the high resistance region is in conformity to a side face of the tunnel junction region.

6. The surface emitting semiconductor laser according to claim 1, wherein the high resistance region contains one of hydrogen and oxygen.

7. The surface emitting semiconductor laser according to claim 1, wherein the high resistance region contains one of ion-implanted hydrogen and ion-implanted oxygen.

8. The surface emitting semiconductor laser according to claim 1, wherein a cross section of the optical cavity mesa is taken along a reference plane intersecting the predetermined axis,
 a cross section of the tunnel junction region is taken along the reference plane, and
 the cross section of the optical cavity mesa has a symmetry, and positions of the centers of mass in the cross sections of the optical cavity mesa and the tunnel junction region are apart from each other on the reference plane.

9. The surface emitting semiconductor laser according to claim 1, wherein the side face of the optical cavity mesa is apart from the side face of the high-resistance region.

10. The surface emitting semiconductor laser according to claim 1, wherein each of the first and second semiconductor spacer layers includes the low-resistance region and the high-resistance region.

11. The surface emitting semiconductor laser according to claim 1, wherein the high-resistance region extends across a junction between the first and second semiconductor spacer layers.

12. The surface emitting semiconductor laser according to claim 11, wherein the low-resistance region extends across the junction.

13. The surface emitting semiconductor laser according to claim 1, wherein the high-resistance region extends in the direction of the predetermined axis, and
   the high-resistance region extends across a junction between the first and second semiconductor spacer layers.

14. The surface emitting semiconductor laser according to claim 1, wherein the low-resistance region extends along side faces of the high-resistance region and the optical cavity mesa.

15. The surface emitting semiconductor laser according to claim 1, wherein the optical cavity mesa includes a semiconductor region,
   the semiconductor region is on the third area, and
   resistivity of the high-resistance region is larger than that of the semiconductor region.

16. The surface emitting semiconductor laser according to claim 1, wherein the optical cavity mesa includes a semiconductor region,
   the semiconductor region is on the third area,
   the semiconductor region surrounds the high-resistance region and the low-resistance region, and
   the semiconductor region is doped with neither ion-implanted hydrogen nor ion-implanted oxygen.

17. The surface emitting semiconductor laser according to claim 1, further comprising a passivation film, the passivation film covering a side and a top of the optical cavity mesa, the passivation film having a window, the window being located on the top of the optical cavity mesa, a size of the window being larger than that of a top of the tunnel junction region, and the second DBR being in contact with the optical cavity mesa through the window.

18. The surface emitting semiconductor laser according to claim 1, further comprising:
   a third semiconductor spacer layer provided on the first distributed Bragg reflector; and
   a second electrode provided on a primary surface of the third semiconductor spacer layer,
   wherein the high-resistance region, the tunnel junction region, and the second electrode are arranged in a line on the third semiconductor spacer layer.

19. The surface emitting semiconductor laser according to claim 1, wherein a part of the first electrode is located above the high-resistance region.

20. The surface emitting semiconductor laser according to claim 1, wherein the first distributed Bragg reflector is made of semiconductor, the second distributed Bragg reflector is made of insulating material, and the second distributed Bragg reflector is on a top of the optical cavity mesa.

* * * * *